United States Patent
Leggette et al.

(10) Patent No.: US 11,818,089 B1
(45) Date of Patent: *Nov. 14, 2023

(54) PROCESSING REQUESTS FOR A DATA RANGE WITHIN A DATA OBJECT IN A DISTRIBUTED STORAGE SYSTEM

(71) Applicant: Pure Storage, Inc., Mountain View, CA (US)

(72) Inventors: Wesley B. Leggette, Chicago, IL (US); Andrew D. Baptist, Mt. Pleasant, WI (US); Greg R. Dhuse, Chicago, IL (US); Jason K. Resch, Chicago, IL (US); Ilya Volvovski, Chicago, IL (US); Manish Motwani, Chicago, IL (US); S. Christopher Gladwin, Chicago, IL (US); Gary W. Grube, Barrington Hills, IL (US); Thomas F. Shirley, Jr., Wauwatosa, WI (US)

(73) Assignee: Pure Storage, Inc.

( * ) Notice: Subject to any disclaimer, the term of this patent is extended or adjusted under 35 U.S.C. 154(b) by 298 days.

This patent is subject to a terminal disclaimer.

(21) Appl. No.: 17/184,193

(22) Filed: Feb. 24, 2021

Related U.S. Application Data

(63) Continuation of application No. 16/861,559, filed on Apr. 29, 2020, now Pat. No. 10,944,712, which is a
(Continued)

(51) Int. Cl.
*H04L 12/58* (2006.01)
*H04L 51/42* (2022.01)
(Continued)

(52) U.S. Cl.
CPC .......... *H04L 51/42* (2022.05); *G06F 9/4881* (2013.01); *G06F 9/5083* (2013.01)

(58) Field of Classification Search
CPC ....................................................... H04L 51/42
See application file for complete search history.

(56) References Cited

U.S. PATENT DOCUMENTS

| 4,092,732 A | 5/1978 | Ouchi |
| 5,454,101 A | 9/1995 | Mackay |

(Continued)

FOREIGN PATENT DOCUMENTS

| EP | 1903750 A1 | 3/2008 |

OTHER PUBLICATIONS

Chung; An Automatic Data Segmentation Method for 3D Measured Data Points; National Taiwan University; pp. 1-8; 1998.
(Continued)

*Primary Examiner* — Simon P Kanaan
(74) *Attorney, Agent, or Firm* — Garlick & Markison; Timothy W. Markison; Kelly H. Hale

(57) ABSTRACT

A method for execution in a storage network includes receiving a request pertaining to a data object, where the request is related to a specified contiguous data range within the data object and the data object is dispersed error encoded to produce a plurality of groups of encoded data slices. The method continues by converting the request into a plurality of partial requests, where each partial request of the plurality of partial requests includes at least one partial task and transmitting each partial request of the plurality of partial requests to a storage unit of a set of storage units. The method then continues by determining when a partial request response has been received for each partial request of the plurality of partial requests and when a partial request response has been received for each partial request of the plurality of partial requests, transmitting an indication that the request pertaining to the data object has been successfully executed.

20 Claims, 10 Drawing Sheets

Related U.S. Application Data continuation of application No. 16/407,894, filed on May 9, 2019, now Pat. No. 10,666,596, which is a continuation-in-part of application No. 15/341,722, filed on Nov. 2, 2016, now Pat. No. 10,303,521, which is a continuation-in-part of application No. 13/865,641, filed on Apr. 18, 2013, now abandoned, which is a continuation-in-part of application No. 13/707,490, filed on Dec. 6, 2012, now Pat. No. 9,304,857.

(60) Provisional application No. 61/569,387, filed on Dec. 12, 2011.

(51) Int. Cl.
*G06F 9/50* (2006.01)
*G06F 9/48* (2006.01)

(56) References Cited

U.S. PATENT DOCUMENTS

| | | |
|---|---|---|
| 5,485,474 A | 1/1996 | Rabin |
| 5,774,643 A | 6/1998 | Lubbers |
| 5,802,364 A | 9/1998 | Senator |
| 5,809,285 A | 9/1998 | Hilland |
| 5,890,156 A | 3/1999 | Rekieta |
| 5,987,622 A | 11/1999 | Lo Verso |
| 5,991,414 A | 11/1999 | Garay |
| 6,012,159 A | 1/2000 | Fischer |
| 6,058,454 A | 5/2000 | Gerlach |
| 6,128,277 A | 10/2000 | Bruck |
| 6,175,571 B1 | 1/2001 | Haddock |
| 6,192,472 B1 | 2/2001 | Garay |
| 6,256,688 B1 | 7/2001 | Suetaka |
| 6,272,658 B1 | 8/2001 | Steele |
| 6,301,604 B1 | 10/2001 | Nojima |
| 6,356,949 B1 | 3/2002 | Katsandres |
| 6,366,995 B1 | 4/2002 | Vilkov |
| 6,374,336 B1 | 4/2002 | Peters |
| 6,415,373 B1 | 7/2002 | Peters |
| 6,418,539 B1 | 7/2002 | Walker |
| 6,449,688 B1 | 9/2002 | Peters |
| 6,567,948 B2 | 5/2003 | Steele |
| 6,571,282 B1 | 5/2003 | Bowman-Amuah |
| 6,609,223 B1 | 8/2003 | Wolfgang |
| 6,718,361 B1 | 4/2004 | Basani |
| 6,760,808 B2 | 7/2004 | Peters |
| 6,785,768 B2 | 8/2004 | Peters |
| 6,785,783 B2 | 8/2004 | Buckland |
| 6,826,711 B2 | 11/2004 | Moulton |
| 6,879,596 B1 | 4/2005 | Dooply |
| 7,003,688 B1 | 2/2006 | Pittelkow |
| 7,024,451 B2 | 4/2006 | Jorgenson |
| 7,024,609 B2 | 4/2006 | Wolfgang |
| 7,080,101 B1 | 7/2006 | Watson |
| 7,103,824 B2 | 9/2006 | Halford |
| 7,103,915 B2 | 9/2006 | Redlich |
| 7,111,115 B2 | 9/2006 | Peters |
| 7,140,044 B2 | 11/2006 | Redlich |
| 7,146,644 B2 | 12/2006 | Redlich |
| 7,171,493 B2 | 1/2007 | Shu |
| 7,222,133 B1 | 5/2007 | Raipurkar |
| 7,240,236 B2 | 7/2007 | Cutts |
| 7,272,613 B2 | 9/2007 | Sim |
| 7,636,724 B2 | 12/2009 | de la Torre |
| 9,058,207 B2 | 6/2015 | Terashima |
| 9,338,140 B2 | 5/2016 | O'Hare |
| 2002/0044657 A1 | 4/2002 | Asano |
| 2002/0062422 A1 | 5/2002 | Butterworth |
| 2002/0166079 A1 | 11/2002 | Ulrich |
| 2003/0018927 A1 | 1/2003 | Gadir |
| 2003/0037261 A1 | 2/2003 | Meffert |
| 2003/0065617 A1 | 4/2003 | Watkins |
| 2003/0084020 A1 | 5/2003 | Shu |
| 2003/0163507 A1 | 8/2003 | Chang et al. |
| 2004/0024963 A1 | 2/2004 | Talagala |
| 2004/0122917 A1 | 6/2004 | Menon |
| 2004/0215998 A1 | 10/2004 | Buxton |
| 2004/0228493 A1 | 11/2004 | Ma |
| 2005/0018853 A1 | 1/2005 | Lain |
| 2005/0100022 A1 | 5/2005 | Ramprashad |
| 2005/0114594 A1 | 5/2005 | Corbett |
| 2005/0125593 A1 | 6/2005 | Karpoff |
| 2005/0131993 A1 | 6/2005 | Fatula, Jr. |
| 2005/0132070 A1 | 6/2005 | Redlich |
| 2005/0144382 A1 | 6/2005 | Schmisseur |
| 2005/0229069 A1 | 10/2005 | Hassner |
| 2006/0047907 A1 | 3/2006 | Shiga |
| 2006/0136448 A1 | 6/2006 | Cialini |
| 2006/0156059 A1 | 7/2006 | Kitamura |
| 2006/0224603 A1 | 10/2006 | Correll, Jr. |
| 2007/0079081 A1 | 4/2007 | Gladwin |
| 2007/0079082 A1 | 4/2007 | Gladwin |
| 2007/0079083 A1 | 4/2007 | Gladwin |
| 2007/0088970 A1 | 4/2007 | Buxton |
| 2007/0174192 A1 | 7/2007 | Gladwin |
| 2007/0214285 A1 | 9/2007 | Au |
| 2007/0234110 A1 | 10/2007 | Soran |
| 2007/0283167 A1 | 12/2007 | Venters, III |
| 2009/0094251 A1 | 4/2009 | Gladwin |
| 2009/0094318 A1 | 4/2009 | Gladwin |
| 2010/0023524 A1 | 1/2010 | Gladwin |
| 2010/0332751 A1 | 12/2010 | Quigley |
| 2011/0071988 A1 | 3/2011 | Resch |

OTHER PUBLICATIONS

Communication pursuant to Article 94(3) EPC; EP Application No. 12856963.9; dated May 26, 2017; 9 pages.

Harrison; Lightweight Directory Access Protocol (LDAP): Authentication Methods and Security Mechanisms; IETF Network Working Group; RFC 4513; Jun. 2006; pp. 1-32.

International Business Machines; Response to EP communication dated May 26, 2017; dated Nov. 1, 2017; 5 pgs.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

(56) References Cited

OTHER PUBLICATIONS

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): String Representation of Distinguished Names; IETF Network Working Group; RFC 4514; Jun. 2006; pp. 1-15.

Zeilenga; Lightweight Directory Access Protocol (LDAP): Technical Specification Road Map; IETF Network Working Group; RFC 4510; Jun. 2006; pp. 1-8.

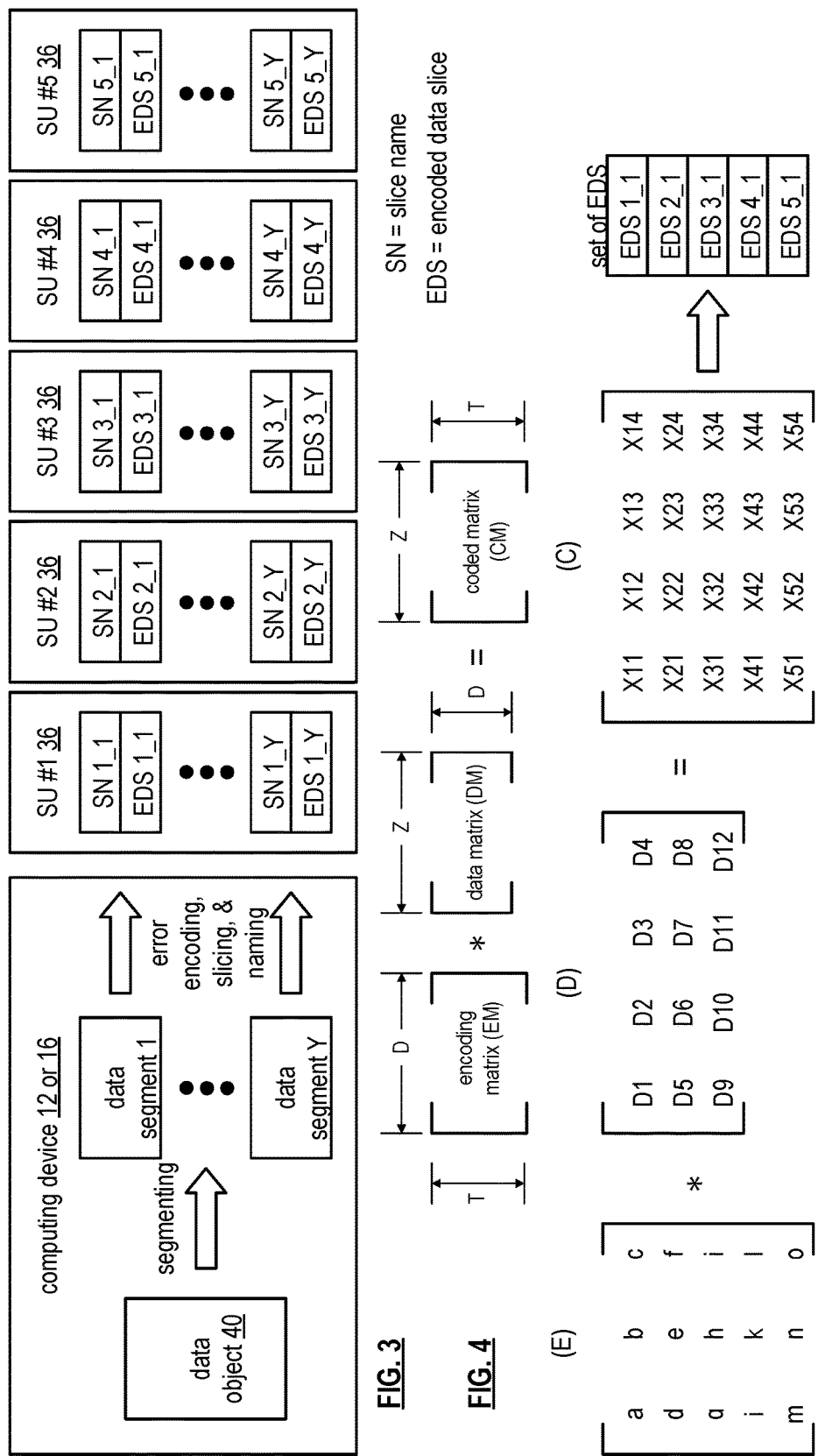

PROCESSING REQUESTS FOR A DATA RANGE WITHIN A DATA OBJECT IN A DISTRIBUTED STORAGE SYSTEM

CROSS-REFERENCE TO RELATED APPLICATIONS

This patent application is claiming priority under 35 U.S.C. § 120 as a continuation of U.S. Utility application Ser. No. 16/861,559, entitled "Partial Task Messaging In A Distributed Storage System," filed Apr. 29, 2020, which is a continuation of U.S. Utility application Ser. No. 16/407,894, entitled "Messaging Via A Shared Memory Of A Distributed Computing System," filed May 9, 2019, issued as U.S. Pat. No. 10,666,596 on May 26, 2020, which is a continuation-in-part of U.S. Utility application Ser. No. 15/341,722, entitled "Determining Task Distribution In A Distributed Computing System," filed Nov. 2, 2016, issued as U.S. Pat. No. 10,303,521 on May 28, 2019, which is a continuation-in-part of U.S. Utility application Ser. No. 13/865,641, entitled "Dispersed Storage Network Secure Hierarchical File Directory," filed Apr. 18, 2013, which is a continuation-in-part of U.S. Utility application Ser. No. 13/707,490, entitled "Retrieving Data From A Distributed Storage Network," filed Dec. 6, 2012, issued as U.S. Pat. No. 9,304,857 on Apr. 5, 2016, which claims priority under 35 U.S.C. § 119 to U.S. Provisional Application No. 61/569,387, entitled "Distributed Storage And Task Processing," filed Dec. 12, 2011, all of which are incorporated by reference herein in their entireties for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
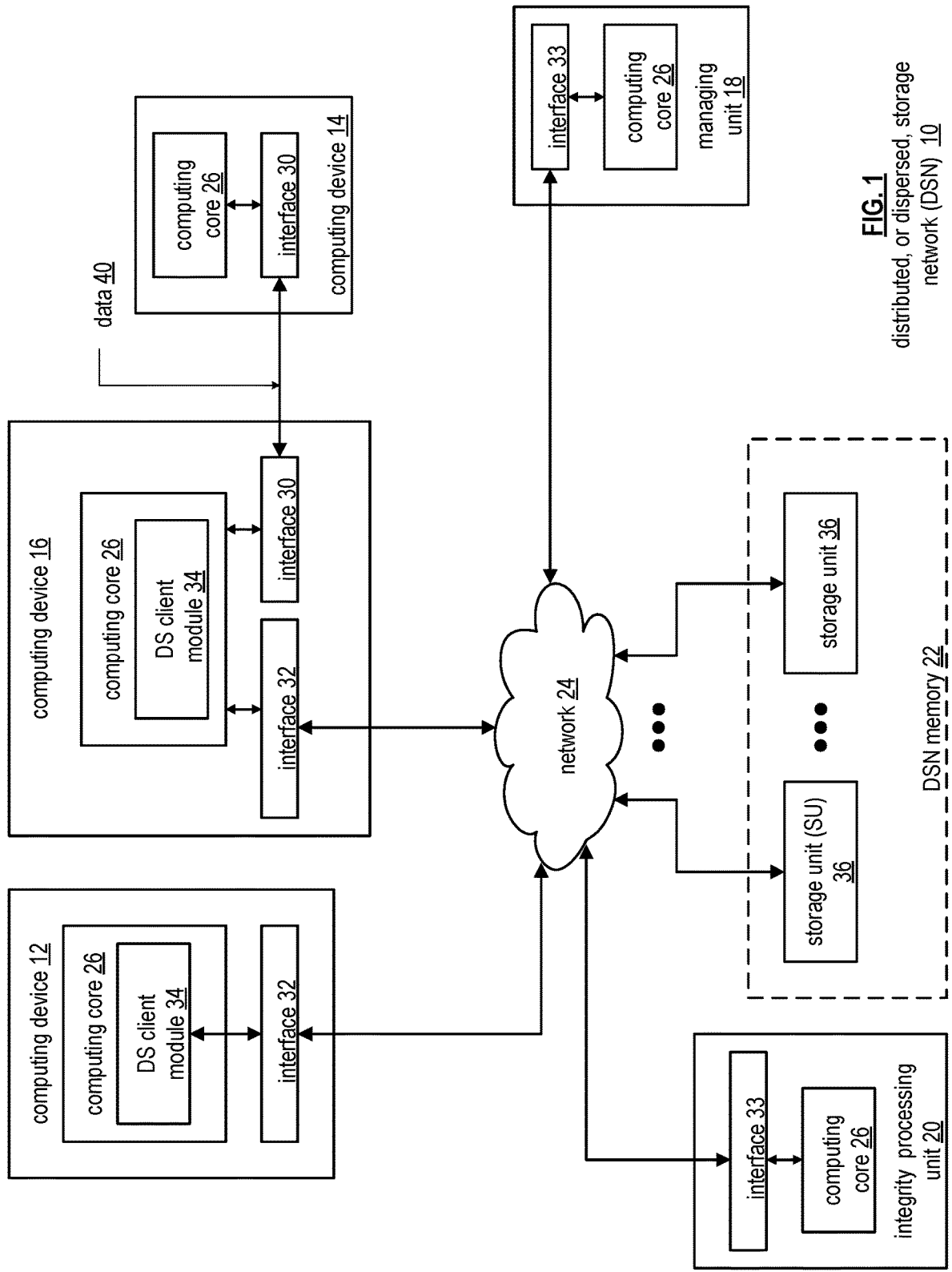
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Throughout the specification, "distributed storage and task (DST) network (DSTN)" and distributed storage network (DSN) are considered interchangeable and can be substituted for one another throughout. Task execution or partial task execution can be performed, in one or more embodiments, by DS processing units and/or DS execution elements located in computing devices or storage units of the DSN.

Figure 2:
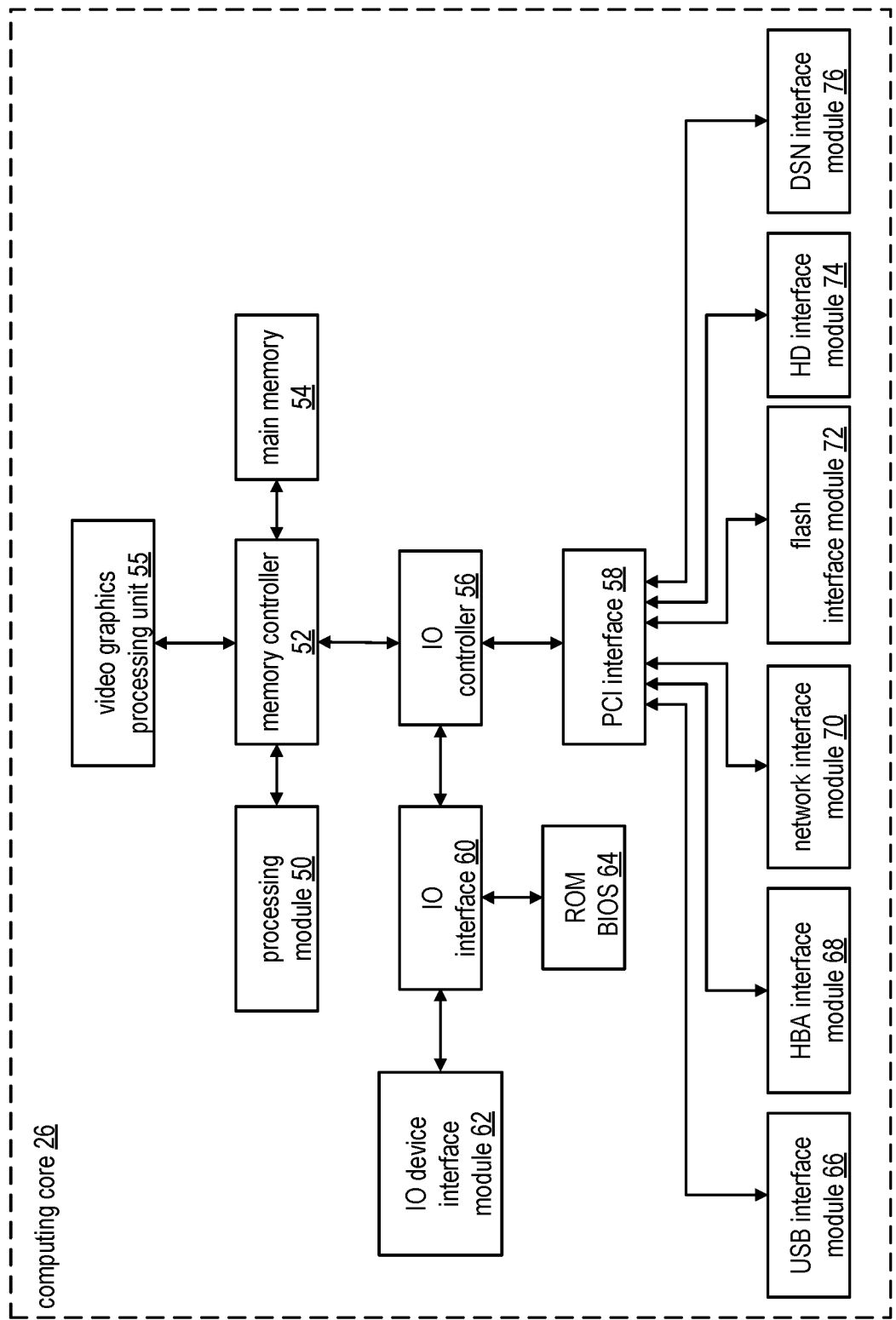
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-11B. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSTN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSTN managing unit 18 tracks the number of times a user accesses a non-public vault and/or public vaults, which can be used to generate per-access billing information. In another instance, the DSTN managing unit 18 tracks the amount of data stored and/or retrieved by a user device and/or a user group, which can be used to generate per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSTN memory 22.

FIG. 2 is a schematic block diagram of an embodiment of a computing core 26 that includes a processing module 50, a memory controller 52, main memory 54, a video graphics processing unit 55, an input/output (TO) controller 56, a peripheral component interconnect (PCI) interface 58, an 10 interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the 10 device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figures 7, 8:
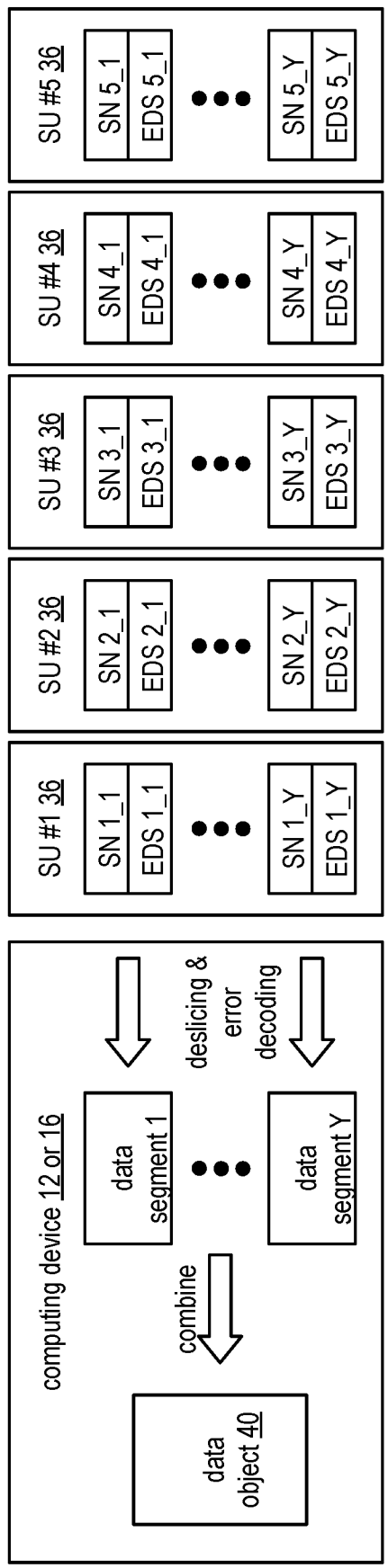
FIG. 7 is a schematic block diagram of an example of dispersed storage error decoding of data in accordance with the present invention.
FIG. 8 is a schematic block diagram of a generic example of an error decoding function in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
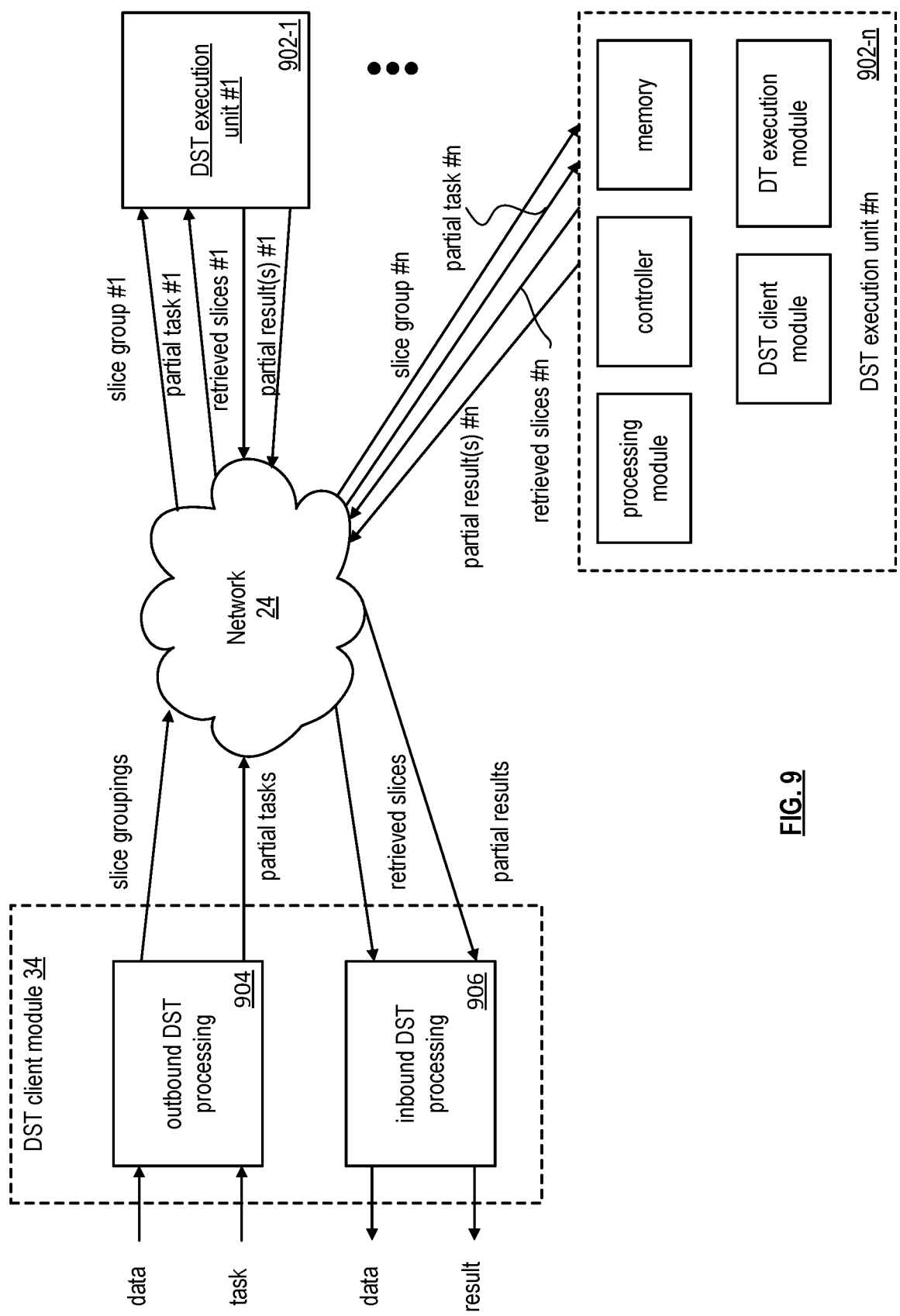
FIG. 9 is a diagram illustrating an example of task partitioning in a distributed storage network in accordance with the present invention.

FIG. 9 is a diagram of an example of performing task partitioning in a distributed storage network (DSN). The distributed computing system includes a DST (distributed storage (DS) and/or task) client module 34 (included in computing/user devices 12, 14, or 16 of FIG. 1), the network 24, a plurality of DST execution units 902 (1-*n*) that form at least a portion of the DSN memory 22, a managing unit 18 (not shown), and the integrity processing unit 20 (not shown). The DST client module 34 includes an outbound DST processing section 904 and an inbound DST processing section 906. Each of the DST execution units 902 (1-*n*) includes a controller, a processing module, memory, a DT (distributed task) execution module, and a DST client module.

In an example of operation, the DST client module receives data and one or more tasks to be performed upon the data. The data may be of any size and of any content, where, due to the size (e.g., greater than a few Terra-Bytes), the content (e.g., secure data, etc.), and/or task(s) (e.g., MIPS intensive), distributed processing of the task(s) on the data is desired. For example, the data may be one or more digital books, a copy of a company's emails, a large-scale Internet search, a video security file, one or more entertainment video files (e.g., television programs, movies, etc.), data files, and/or any other large amount of data (e.g., greater than a few Terra-Bytes).

Within the DST client module, the outbound DST processing section 904 receives the data and the task(s). The outbound DST processing section processes the data to produce slice groupings. As an example of such processing, the outbound DST partitions the data into a plurality of data partitions. For each data partition, the outbound DST processing section dispersed storage (DS) error encodes it to produce encoded data slices and groups the encoded data slices into a slice grouping. In addition, the outbound DST processing section partitions the task into partial tasks, where the number of partial tasks may correspond to the number of slice groupings.

The outbound DST processing section then sends, via the network, the slice groupings and the partial task to the DST execution units of the DSTN module. For example, the outbound DST processing section sends slice group 1 and partial task 1 to DST execution unit 1. As another example, the outbound DST processing section sends slice group #n and partial task #n to DST execution unit #n.

Each DST execution unit performs its partial task upon its slice group to produce partial results. For example, DST execution unit #1 performs partial task #1 on slice group #1 to produce a partial result #1, or results. As a more specific example, slice group #1 corresponds to a data partition of a series of digital books and the partial task #1 corresponds to searching for specific phrases, recording where the phrase is found, and establishing a phrase count. In this more specific example, the partial result #1 includes information as to where the phrase was found and includes the phrase count.

Upon completion of generating their respective partial results, the DST execution units send, via the network, their partial results to the inbound DST processing section 906 of the DST client module. The inbound DST processing section processes the received partial results to produce a result. Continuing with the specific example of the preceding paragraph, the inbound DST processing section combines the phrase count from each of the DST execution units to produce a total phrase count. In addition, the inbound DST processing section combines the 'where the phrase was found' information from each of the DST execution units within their respective data partitions to produce 'where the phrase was found' information for the series of digital books.

In another example of operation, the DST client module requests retrieval of stored data within the memory of the DST execution units (e.g., memory of the DSTN module). In this example, the task is "retrieve data stored in the memory of the DSTN module". Accordingly, the outbound DST processing section converts the task into a plurality of partial tasks and sends the partial tasks to the respective DST execution units.

In response to the partial task of retrieving stored data, a DST execution unit identifies the corresponding encoded data slices and retrieves them. For example, DST execution unit #1 receives partial task #1 and retrieves, in response thereto, retrieved slices #1. The DST execution units send the their respective retrieved slices to the inbound DST processing section via the network.

The inbound DST processing section converts the received slices into data. For example, the inbound DST processing section de-groups the received slices to produce encoded slices per data partition. The inbound DST processing section then DS error decodes the encoded slices per data partition to produce data partitions. The inbound DST processing section de-partitions the data partitions to recapture the data.

Figure 10:
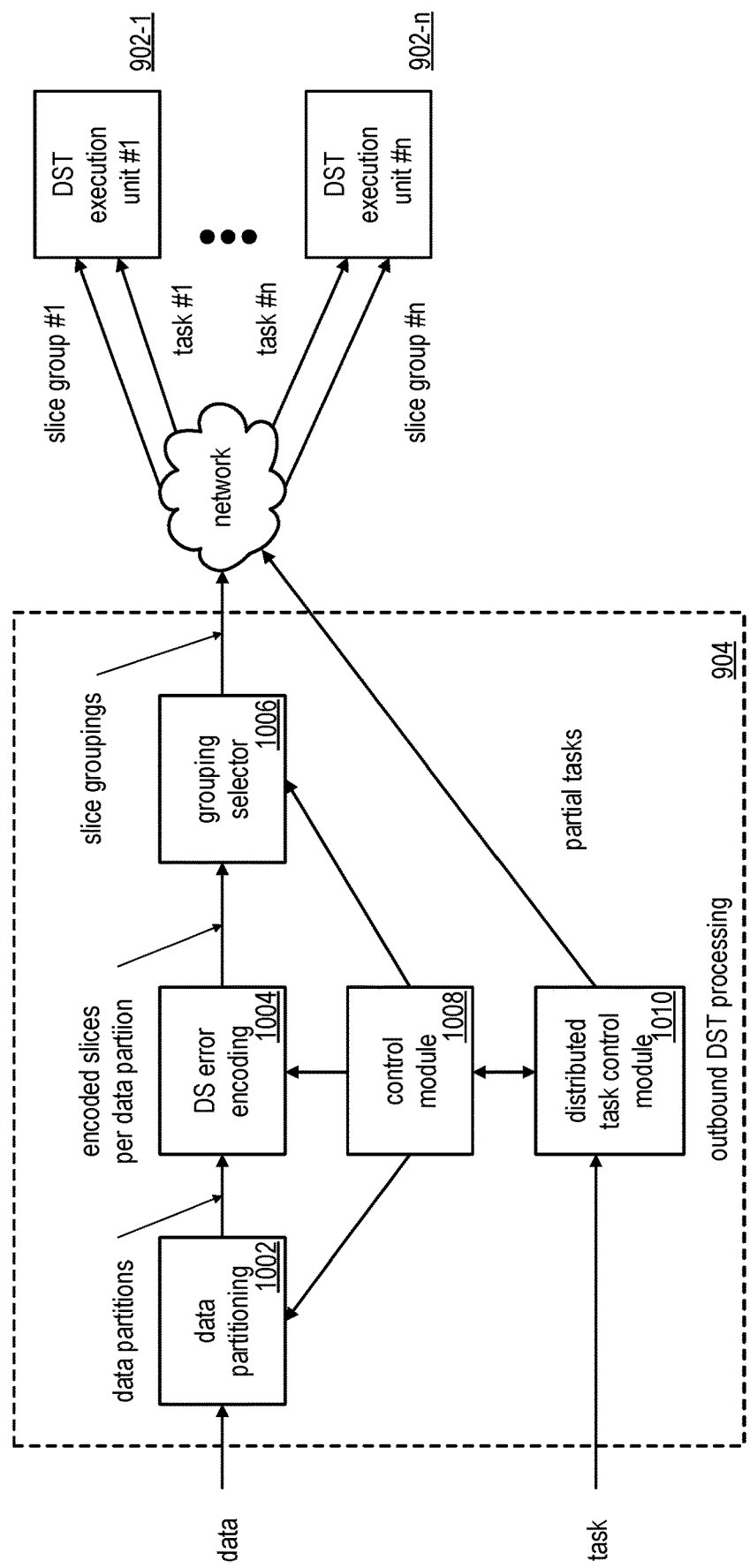
FIG. 10 is a schematic block diagram of an embodiment of an outbound distributed storage and/or task (DST) processing section of a DST client module coupled to a DSTN module via a network in accordance with the present invention.

FIG. 10 is a schematic block diagram of an embodiment of an outbound distributed storage and/or task (DST) processing section of a DST client module coupled to a DSTN module (e.g., a plurality of DST execution units) via a network. The outbound DST processing section 904 includes a data partitioning module 1002, a dispersed storage (DS) error encoding module 1004, a group selection module 1006, a control module 1008, and a distributed task control module 1010.

In an example of operation, the data partitioning module partitions the data into a plurality of data partitions. The number of partitions and the size of the partitions may be selected by the control module based on the data (e.g., its size, its content, etc.), the task to be performed (e.g., simple, complex, single step, multiple steps, etc.), the DS encoding parameters (pillar width, decode threshold, write threshold, segment security parameters, slice security parameters, etc.), the capabilities of the DST execution units (e.g., processing resources, availability of processing recourses, etc.), and/or as may be inputted by a user, system administrator, or other operator (human or automated). For example, the data partitioning module may partition the data (e.g., 100 Terra-Bytes) into 100,000 data segments, each being 1 Giga-Byte in size. Alternatively, the data partitioning module may partition the data into a plurality of data segments, where some of data segments are of a different size, are of the same size, or a combination thereof.

The DS error encoding module receives the data partitions in a serial manner, a parallel manner, and/or a combination thereof. For each data partition, the DS error encoding module DS error encodes the data partition in accordance with control information from the control module to produce encoded data slices. The DS error encoding, as previously described in FIGS. 3-6, includes segmenting the data partition into data segments, segment security processing (e.g., encryption, compression, watermarking, integrity check (e.g., CRC), etc.), error encoding, slicing, and/or per slice security processing (e.g., encryption, compression, watermarking, integrity check (e.g., CRC), etc.). The control information indicates which steps of the DS error encoding are active for a given data partition and, for active steps, indicates the parameters for the step. For example, the control information indicates that the error encoding is active and includes error encoding parameters (e.g., pillar width, decode threshold, write threshold, read threshold, type of error encoding, etc.).

The group selecting module 1006 groups the encoded slices of a data partition into a set of slice groupings. The number of slice groupings corresponds to the number of DST execution units identified for the particular task. For example, if five DST execution units are identified for the particular task, the group selecting module will group the encoded slices of a data partition into five slice groupings. The group selecting module outputs the slice groupings to the corresponding DST execution units via the network.

The distributed task control module 1010 receives the task and converts it into a set of partial tasks. For example, the distributed task control module receives a task to find where in the data (e.g., a series of books) a phrase occurs and a total count of the phrase usage in the data. In this example, the distributed task control module replicates the task for each DST execution unit to produce the partial tasks. In another example, the distributed task control module receives a task to find where in the data a first phrase occurs, wherein in the data a second phrase occurs, and a total count for each phrase usage in the data. In this example, the distributed task control module generates a first set of partial tasks for finding and counting the first phase and a second set of partial tasks for fining and counting the second phrase. The distributed task control module may send respective first and/or second partial tasks to each DST execution unit.

Figure 11:
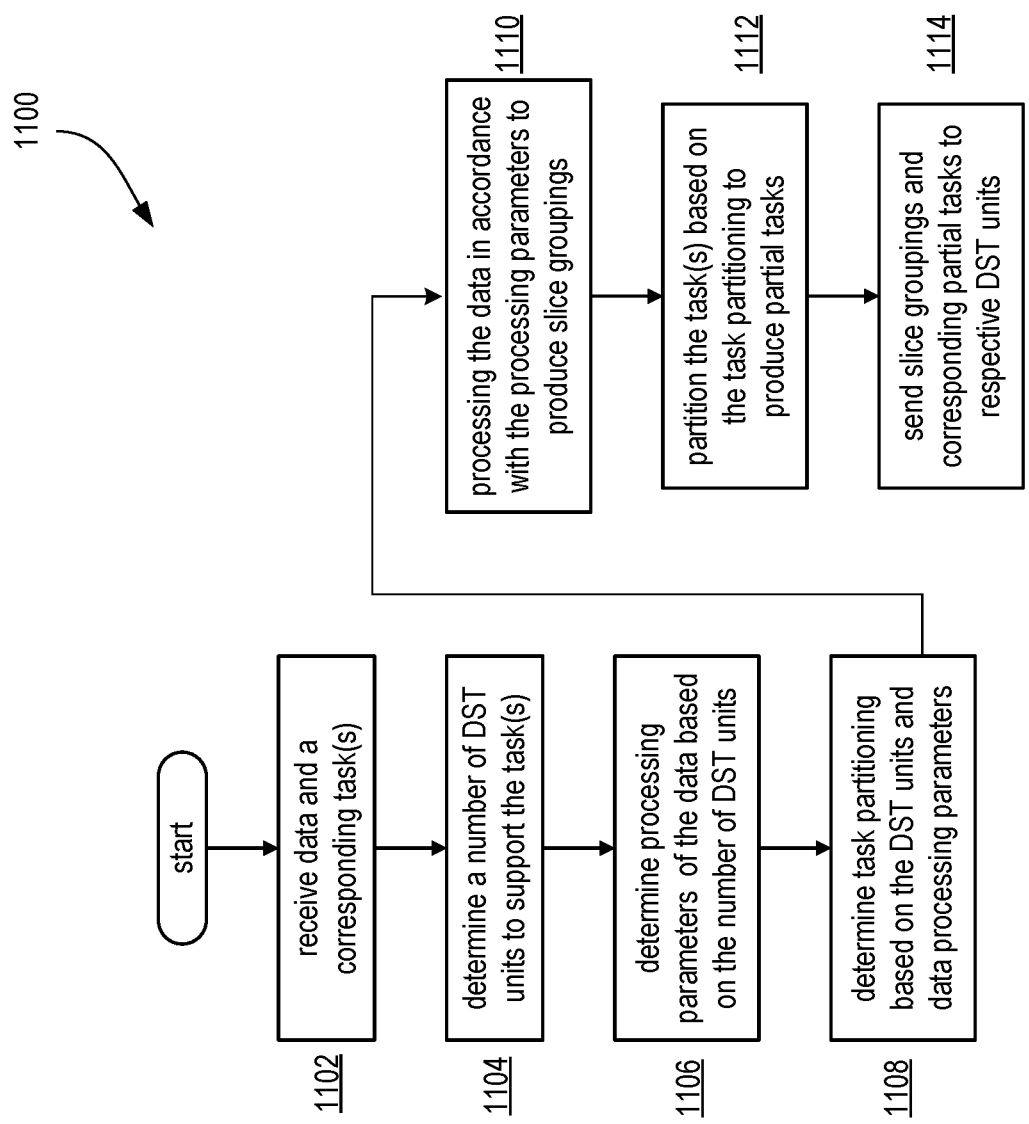
FIG. 11 is a logic diagram of an example of a method for outbound distributed storage and task (DST) processing in accordance with the present invention.

FIG. 11 is a logic diagram of an example of a method 1100 for outbound distributed storage and task (DST) processing that begins with step 1102 with a DST client module receiving data and one or more corresponding tasks. The method continues, in step 1104, with the DST client module determining a number of DST units to support the task for one or more data partitions. For example, the DST client module may determine the number of DST units to support the task based on the size of the data, the requested task, the content of the data, a predetermined number (e.g., user indicated, system administrator determined, etc.), available DST units, capability of the DST units, and/or any other factor regarding distributed task processing of the data. The DST client module may select the same DST units for each data partition, may select different DST units for the data partitions, or a combination thereof.

The method continues, in step 1106, with the DST client module determining processing parameters of the data based on the number of DST units selected for distributed task processing. The processing parameters include data partitioning information, DS encoding parameters, and/or slice grouping information. The data partitioning information includes a number of data partitions, size of each data partition, and/or organization of the data partitions (e.g., number of data blocks in a partition, the size of the data blocks, and arrangement of the data blocks). The DS encoding parameters include segmenting information, segment security information, error encoding information, slicing information, and/or per slice security information. The slice grouping information includes information regarding how to arrange the encoded data slices into groups for the selected DST units. As a specific example, if, the DST client module determines that five DST units are needed to support the task, then it determines that the error encoding parameters include a pillar with the five and a decode threshold of three.

The method continues, in step 1108, with the DST client module determining task partitioning information (e.g., how to partition the tasks) based on the selected DST units and data processing parameters. The data processing parameters include the processing parameters and DST unit capability information. The DST unit capability information includes the number of DT (distributed task) execution units, execution capabilities of each DT execution unit (e.g., MIPS capabilities, processing resources (e.g., quantity and capability of microprocessors, CPUs, digital signal processors, co-processor, microcontrollers, arithmetic logic circuitry, and/or and the other analog and/or digital processing circuitry), availability of the processing resources, memory information (e.g., type, size, availability, etc.), and/or any information germane to executing one or more tasks.

The method continues, in step 1110, with the DST client module processing the data in accordance with the processing parameters to produce slice groupings. The method continues, in step 1112, with the DST client module partitioning the task based on the task partitioning information to produce a set of partial tasks. The method continues, in step 1114, with the DST client module sending the slice groupings and the corresponding partial tasks to the selected DST units.

Figure 12:
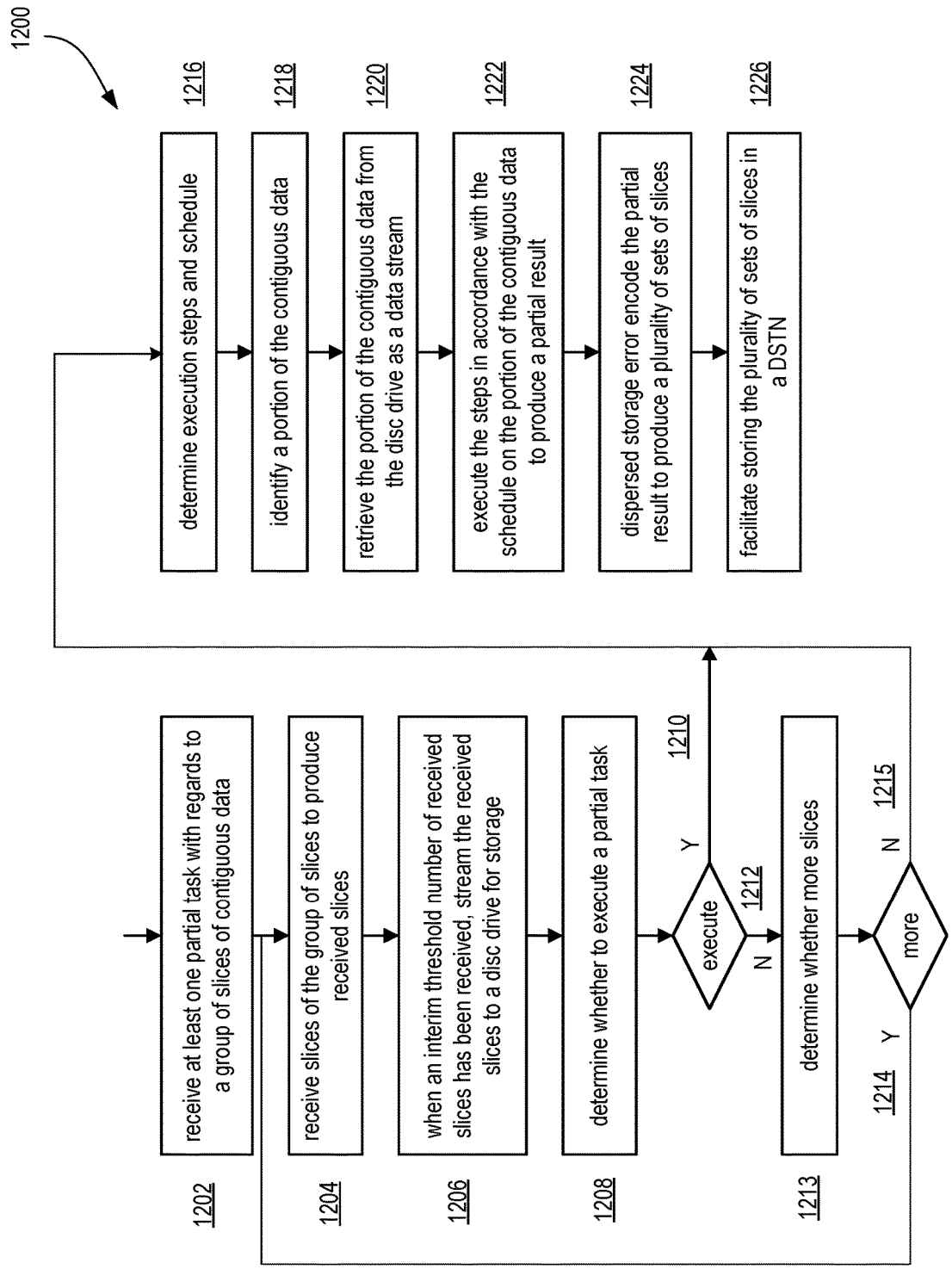
FIG. 12 is a flowchart illustrating an example of task partitioning and processing in a distributed storage network in accordance with the present invention.

FIG. 12 is a flowchart illustrating an example of task partitioning and processing in a distributed storage network. The method begins, in step 1202, where a processing module (e.g., of a distributed task (DT) execution module of a distributed storage and task execution (DST EX) unit embedded within a disk drive unit) receives at least one partial task with regards to a group of slices of contiguous data (e.g., from a DST client module). The method continues, in step 1204, where the processing module receives slices of the group of slices to produce received slices. The method continues, in step 1206, where, when an interim threshold number (e.g., a maximum number of bytes limited by an ingestion cache memory) of received slices has been received, the processing module streams the received slices to a disk drive for storage therein. The streaming may provide a write bandwidth system improvement for the group of slices (e.g., as the group of slices pertain to the contiguous data).

The method continues, in step 1208, where the processing module determines whether to execute a partial task. The determination may be based on one or more of comparing an amount of data received to a data threshold, a partial task type, task execution resource availability, or a task schedule. For example, the processing module determines to execute the partial task when data of the received slices can be processed in accordance with a partial task. The method branches to the step 1210 where the processing module determines execution steps and a schedule when the processing module determines to execute the partial task. The method continues to the next step 1212 when the processing module determines not to execute the partial task.

The method continues, in step 1213, where the processing module determines whether more slices are expected. The determination may be based on one or more of a contiguous data size indicator, a query, a lookup, or a number of bytes received so far. The method repeats, in step 1214, back to step 1204 where the processing module receives slices of the group of slices to produce received slices when the processing module determines that there are more slices. The method continues step 1216 when the processing module determines, in step 1215, that there are no more slices.

In step 1216, the processing module determines execution steps and the schedule. The determination may be based on one or more of the at least one partial task, the data, a previous task schedule, a schedule template, a task execution resource availability level, or a task execution requirement. The method continues, in step 1218, where the processing module identifies a portion of the contiguous data for execution of one or steps of the execution steps. The identifying includes matching the portion of the contiguous data to the one or more steps of execution steps based on one or more of a data type indicator associated with the portion, a data type associated with or more steps, or a data available indicator.

The method continues, in step 1220, where the processing module retrieves the portion of the contiguous data from the disk drive as a data stream. The retrieving includes accessing the disk drive for multiple contiguous data bytes. The streaming may provide a read bandwidth system improvement for the portion of data. The method continues, in step 1222, where the processing module executes the steps in accordance with the schedule on the portion of the contiguous data to produce a partial result. For example, the processing module executes a search partial task on the portion to produce a search partial result.

The method continues, in step 1224, where the processing module dispersed storage error encodes the partial results produce a plurality of sets of slices in accordance with dispersal parameters associated with one or more of the group of slices and the at least one partial task. The method continues, in step 1226, where the processing module facilitates storing a plurality of sets of slices in a dispersed storage and task network (DSTN). For example, the processing module sends groups of slices to a DST EX unit, wherein the slices are of a common pillar number when a storage method indicates dispersed storage. As another example, the processing module sends groups of slices to a DST EX unit, wherein the slices are of two or more pillar number when a storage method indicates distributed task storage to enable subsequent task execution on the partial result. In addition, the processing module may receive more slices for more execution steps.

Figure 13A:
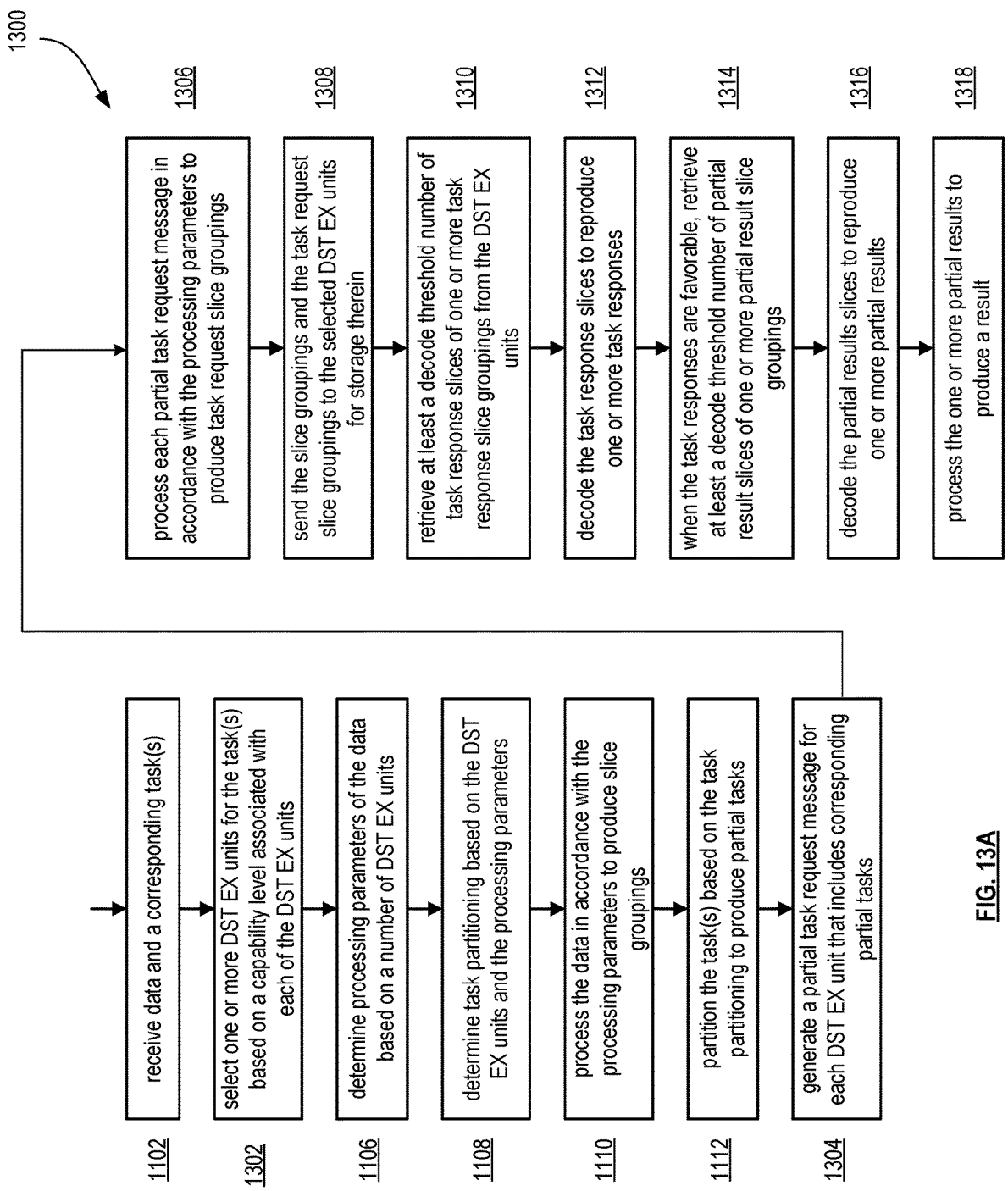
FIG. 13A is a flowchart illustrating another example of task partitioning and processing in a distributed storage network in accordance with the present invention.

FIG. 13A is another a flowchart illustrating an example 1300 of task partitioning and processing in a distributed storage network that includes one or more steps of FIG. 11. In particular, a method is presented for use in conjunction with one or more functions and features described in conjunction with FIGS. 1-12 and 13B.

The method begins with step 1102, where a processing module (e.g., of a distributed storage and task (DST) client module) receives data and a corresponding task and continues with step 1302 where the processing module select one or more DST execution units for the task based on a capability level associated with each of the DST execution units. The method continues with steps 1106-1112, where the processing module determines processing parameters of the data based on a number of DST execution units (1106), determines task partitioning based on the DST execution units and the processing parameters (1108), processes the data in accordance with the processing parameters to produce slice groupings (1110), and partitions the task based on the task partitioning to produce partial tasks (1112).

The method continues at step 1304, where the processing module generates a partial task request message for each DST execution unit that includes corresponding partial tasks. As such, a mailbox message is produced corresponding to each partial task request message. The method continues at step 1306, where the processing module processes each partial task request message in accordance with the processing parameters to produce task request slice groupings. The processing includes generating slices such that each message is directed to a corresponding DST execution unit. The method continues at step 1308, where the processing module sends the slice groupings and the task request slice groupings to the selected DST execution units for storage therein. For example, processing module sends a second slice grouping and a second task request slice grouping to a DST execution unit, wherein the second slice grouping corresponds to the second task request slice grouping.

The method continues at step 1310, where the processing module retrieves at least a decode threshold number of task response slices of one or more task response slice groupings from the DST execution units. The retrieving includes one or more of generating a retrieval request for slices that are of contiguous bytes of a task response and sending the retrieval request to a corresponding DST execution unit. The method continues at step 1312, where the processing module decodes the task response slices to reproduce one or more task responses. The decoding includes at least one of aggregating the task response slices to reproduce the one or more task responses when the decode threshold number of task response slices correspond to data of the task responses (e.g., and not error coded data).

The method continues at step 1314, when the task responses are favorable, the processing module retrieves at least a decode threshold number of partial result slices of one or more partial result slice groupings. The retrieving includes one or more of generating a retrieval request for slices that are of contiguous bytes of a partial result or sending the retrieval request to a corresponding DST execution unit. The method continues at step 1316, where the processing module decodes the partial results slices to reproduce one or more partial results. The decoding includes at least one of aggregating the partial results slices to reproduce the one or more partial results when the decode threshold number of partial results slices correspond to data of the partial results (e.g., and not error coded data). The method continues at step 1318, where the processing module processes the one or more partial results to produce a result. For example, the processing module aggregates the partial results to produce the result.

Figure 13B:
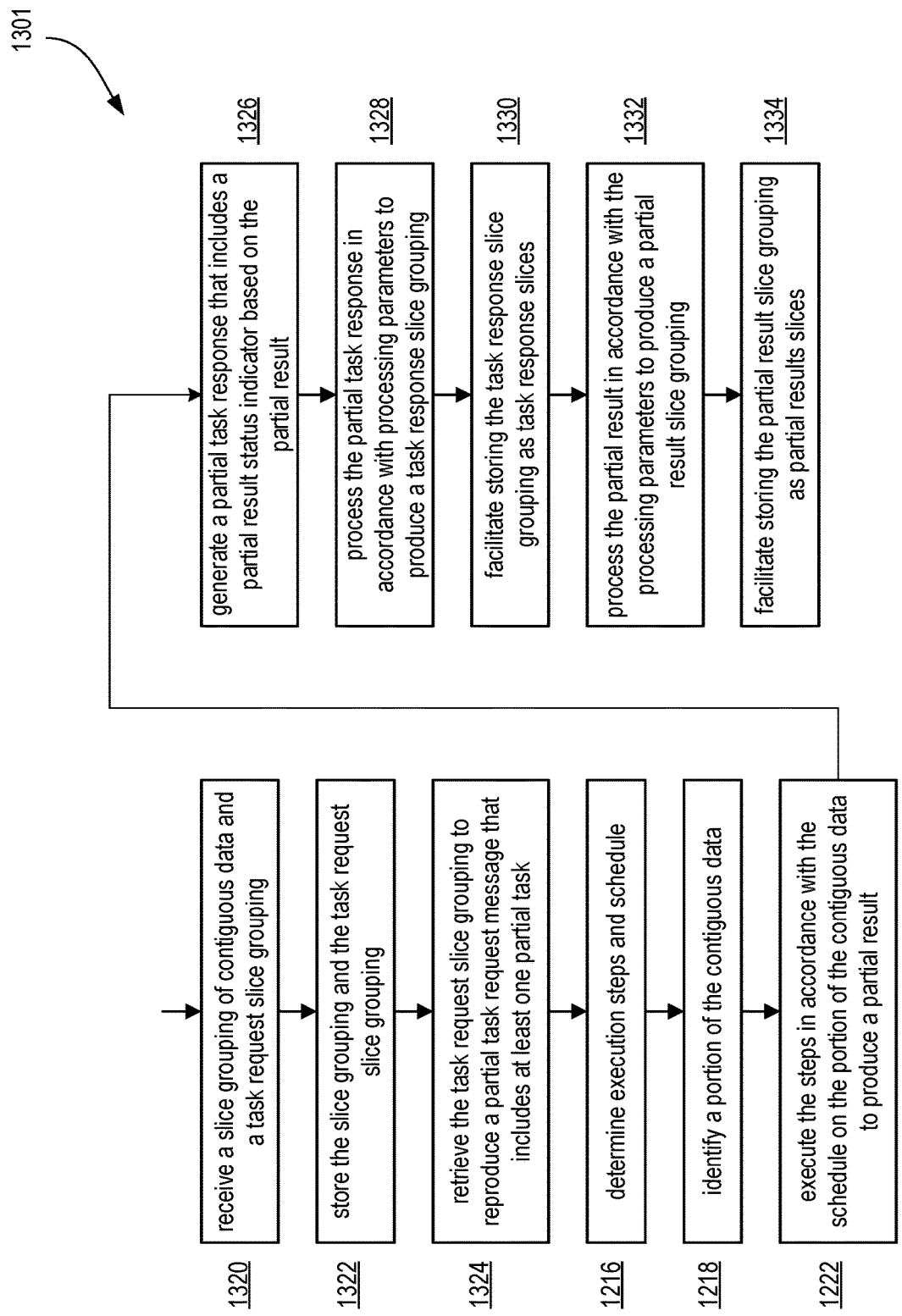
FIG. 13B is a flowchart illustrating yet another example of task partitioning and processing in a distributed storage network in accordance with the present invention.

FIG. 13B is a flowchart illustrating another example 1301 of task partitioning and processing in a distributed storage network that includes one or more steps from FIG. 12. In particular, a method is presented for use in conjunction with one or more functions and features described in conjunction with FIGS. 1-13A.

The method begins, in step 1320, where a processing module (e.g., of a distributed storage and task (DST) execution unit) receives a slice grouping of contiguous data and a corresponding task request slice grouping (e.g., from a DST client module). The method continues at step 1322, for the processing module stores the slice grouping and the task request slice grouping (e.g., in accordance with a received storage task). For example, the processing module stores the slice grouping and the task request slice grouping in a local memory (e.g., as a mailbox).

The method continues at step 1324, where the processing module retrieves the task request slice grouping to reproduce a partial task request message that includes at least one partial task (e.g., retrieving a mail message from the mailbox). The method continues with step 1216, where the processing module determines execution steps in the schedule, identifies, in step 1218, a portion of the contiguous data, and executes, in step 1222, the steps in accordance with the schedule on the portion of the contiguous data to produce a partial result. The method continues at step 1326, where the processing module generates a partial task response that includes a partial result status indicator based on the partial result. The partial result status indicator includes one of a result ready status level or a result not ready status level.

The method continues at step 1328, where the processing module processes the partial task response in accordance with the processing parameters to produce a task response slice grouping. In addition, the processing module may utilize zero information gain (ZIG) partial slice encoding to generate error coded task response slices based on one or more of a number of participating pillars, the task response slice grouping, a previous task response slice grouping, an encoding matrix, an error coded data pillar number, or a zero information gain slice building approach. The method continues at step 1330, where the processing module facilitates storing the task response slice grouping as task response slices. For example, the processing module sends the task response slice groupings to a distributed storage and task network (DSTN) for storage therein (e.g., a return mailbox).

The method continues at step 1332, where the processing module processes the partial result in accordance with the processing parameters to produce a partial result slice grouping. In addition, the processing module may utilize zero information gain (ZIG) partial slice encoding to generate error coded partial result slices based on one or more of a number of participating pillars, the partial result slice grouping, a previous partial result slice grouping, an encoding matrix, an error coded data pillar number, or a zero information gain slice building approach. The method continues at step 1334, where the processing module facilitates storing the partial result slice grouping as partial results slices. For example, the processing module sends the partial results slice groupings to the distributed storage and task network (DSTN) for storage therein (e.g., a return mailbox).

The method described above in conjunction with the processing module can alternatively be performed by other modules of the dispersed storage network or by other computing devices. In addition, at least one memory section (e.g., a non-transitory computer readable storage medium) that stores operational instructions can, when executed by one or more processing modules of one or more computing devices of the dispersed storage network (DSN), cause the one or more computing devices to perform any or all of the method steps described above.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a storage network, the method comprises:
   receiving a request pertaining to a data object, wherein the request is related to a specified contiguous data range within the data object, wherein the data object is dispersed error encoded to produce a plurality of groups of encoded data slices;
   based on the specified contiguous data range, converting the request into a plurality of partial requests, wherein each partial request of the plurality of partial requests includes at least one partial task;
   transmitting each partial request of the plurality of partial requests to a storage unit of a set of storage units;
   determining when a partial request response has been received for each partial request of the plurality of partial requests; and
   when a partial request response has been received for each partial request of the plurality of partial requests, transmitting an indication that the request pertaining to the data object has been successfully executed.

2. The method of claim 1, wherein each partial request of the plurality of partial requests includes a group of encoded data slices of a plurality of groups of encoded data slices, wherein each group of encoded data slices of a plurality of groups is associated with a portion of the specified contiguous data range.

3. The method of claim 1, wherein the request pertaining to the data object includes retrieving data in the specified contiguous data range.

4. The method of claim 1, wherein the request pertaining to the data object includes a write request for the specified contiguous data range.

5. The method of claim 1, wherein the partial request response includes one or more encoded data slices.

6. The method of claim 1, wherein at least two partial requests of the plurality of partial requests are transmitted to a same storage unit of the set of storage units.

7. The method of claim 1, further comprising:
   determining a number of encoded data slices of the group of encoded data slices required to execute the request.

8. The method of claim 1, wherein the request pertaining to the data object includes adding an encoded data slice associated with the specified contiguous data range.

9. The method of claim 1, wherein the request pertaining to the data object includes replacing the specified contiguous data range in the data object.

10. A computing device comprising:
    an interface configured to interface and communicate with a distributed storage network (DSN);
    memory that stores operational instructions; and
    a processing module operably coupled to the interface and to the memory, wherein the processing module, when operable within the computing device based on the operational instructions, is configured to:
      receive a request pertaining to a data object, wherein the request is related to a specified contiguous data range within the data object, wherein the data object is dispersed error encoded to produce a plurality of groups of encoded data slices;
      based on the specified contiguous data range, convert the request into a plurality of partial requests, wherein each partial request of the plurality of partial requests includes at least one partial task;
      transmit each partial request of the plurality of partial requests to a storage unit of a set of storage units;
      determine when a partial request response has been received for each partial request of the plurality of partial requests; and
      when a partial request response has been received for each partial request of the plurality of partial requests, transmit an indication that the request pertaining to the data object has been successfully executed.

11. The computing device of claim 10, wherein each partial request of the plurality of partial requests includes a group of encoded data slices of a plurality of groups of encoded data slices, wherein each group of encoded data slices of a plurality of groups is associated with a portion of the specified contiguous data range.

12. The computing device of claim 10, wherein the request pertaining to the data object includes retrieving data in the specified contiguous data range.

13. The computing device of claim 10, wherein the request pertaining to the data object includes a write request for the specified contiguous data range.

14. The computing device of claim 10, wherein the partial request response includes one or more encoded data slices.

15. The computing device of claim 10, wherein at least two partial requests of the plurality of partial requests are transmitted to a same storage unit of the set of storage units.

16. The computing device of claim 10, wherein the computing device based on the operational instructions, is further configured to:
    determine a number of encoded data slices of the group of encoded data slices required to execute the request.

17. A method for execution by a storage unit of a distributed storage network (DSN), the method comprises:
    receiving a partial request of a plurality of partial requests, wherein the plurality of partial requests are converted from a request pertaining to a data object, wherein the request is related to a specified contiguous data range within the data object, wherein the partial request includes a partial task pertaining to a group of encoded data slices stored in the storage unit;
    executing the partial request to produce a partial result;
    generating a partial task response that includes a partial result status indicator based on the partial result.

18. The method of claim 17, wherein the request pertaining to the data object includes retrieving data in the specified contiguous data range.

19. The method of claim 17, wherein the request pertaining to the data object includes a write request for the specified contiguous data range.

20. The method of claim 17, wherein the request pertaining to the data object includes adding an encoded data slice associated with the specified contiguous data range.

* * * * *